United States Patent
Wylie et al.

(10) Patent No.: US 8,250,427 B2
(45) Date of Patent: Aug. 21, 2012

(54) SELECTING ERASURE CODES FOR A FAULT TOLERANT SYSTEM

(75) Inventors: John Johnson Wylie, San Francisco, CA (US); Ram Swaminathan, Cupertino, CA (US)

(73) Assignee: Hewlett-Packard Development Company, Houston, TX (US)

( * ) Notice: Subject to any disclaimer, the term of this patent is extended or adjusted under 35 U.S.C. 154(b) by 994 days.

(21) Appl. No.: 12/243,471

(22) Filed: Oct. 1, 2008

(65) Prior Publication Data

US 2010/0083069 A1 Apr. 1, 2010

Related U.S. Application Data

(60) Provisional application No. 61/073,660, filed on Jun. 18, 2008.

(51) Int. Cl.
*H03M 13/00* (2006.01)

(52) U.S. Cl. ......... 714/752; 714/777; 714/6.24; 714/6.2

(58) Field of Classification Search ........................ None
See application file for complete search history.

(56) References Cited

U.S. PATENT DOCUMENTS

| | | | |
|---|---|---|---|
| 4,295,218 A * | 10/1981 | Tanner | 714/762 |
| 5,712,861 A | 1/1998 | Inoue | |
| 5,754,563 A | 5/1998 | White | |
| 7,313,749 B2 | 12/2007 | Nerl | |
| 7,350,126 B2 | 3/2008 | Winograd | |
| 7,409,625 B2 | 8/2008 | Corbett | |
| 7,412,641 B2 | 8/2008 | Shokrollahi | |
| 7,853,823 B2 | 12/2010 | Deenadhayalan | |
| 7,870,464 B2 | 1/2011 | Hafner | |
| 2009/0083590 A1 * | 3/2009 | Wylie et al. | 714/703 |

OTHER PUBLICATIONS

Wylie, J.J.; Swaminathan, R.; , "Determining Fault Tolerance of XOR-Based Erasure Codes Efficiently," Dependable Systems and Networks, 2007. DSN '07. 37th Annual IEEE/IFIP International Conference on , vol., No., pp. 206-215, Jun. 25-28, 2007 doi: 10.1109/DSN.2007.32.*
U.S. Appl. No. 11/904,284, Notice of Allowance dated Nov. 23, 2011, pp. 1-9 and attachment.

* cited by examiner

*Primary Examiner* — M. Mujtaba K Chaudry
*Assistant Examiner* — Justin R Knapp

(57) ABSTRACT

A technique for selecting an erasure code from a plurality of erasure codes for use in a fault tolerant system comprises generating a preferred set of erasure codes based on characteristics of the codes' corresponding Tanner graphs. The fault tolerances of the preferred codes are compared based at least on the Tanner graphs. A more fault tolerant code is selected based on the comparison.

17 Claims, 5 Drawing Sheets

SELECTING ERASURE CODES FOR A FAULT TOLERANT SYSTEM

CROSS REFERENCE TO RELATED APPLICATION

This application claims the benefit under 35 U.S.C. §119 (e) of U.S. Provisional Application No. 61/073,660, entitled "SELECTING ERASURE CODES FOR A FAULT TOLERANT SYSTEM," filed Jun. 18, 2008.

BACKGROUND

Network systems and storage devices need to reliably handle and store data and, thus, typically implement some type of scheme for recovering data that has been lost, degraded or otherwise compromised. At the most basic level, one recovery scheme could simply involve creating one or more complete copies or mirrors of the data being transferred or stored. Although such a recovery scheme may be relatively fault tolerant, it is not very efficient with respect to the need to duplicate storage space. Other recovery schemes involve performing a parity check. Thus, for instance, in a storage system having stored data distributed across multiple disks, one disk may be used solely for storing parity bits. While this type of recovery scheme requires less storage space than a mirroring scheme, it is not as fault tolerant, since any two device failures would result in an inability to recover any compromised data.

Thus, various recovery schemes have been developed with the goal of increasing efficiency (in terms of the amount of extra data generated) and fault tolerance (i.e., the extent to which the scheme can recover compromised data). These recovery schemes generally involve the creation of erasure codes that are adapted to generate and embed data redundancies within original data packets, thereby encoding the data packets in a prescribed manner. If such data packets become compromised, as may result from a disk or sector failure, for instance, such redundancies could enable recovery of the compromised data, or at least portions thereof. Various types of erasure codes are known, such as Reed-Solomon codes, RAID variants, array codes (e.g., EVENODD, RDP, etc.) and XOR-based erasure codes. However, encoding or decoding operations of such erasure codes often are computationally demanding, typically rendering their implementation cumbersome in network systems, storage devices, and the like.

In addition, determining the fault tolerance of a particular erasure code, and thus the best manner in which to implement a chosen code can be challenging. For instance, fault tolerance determinations often do not factor in the fault tolerance of the devices themselves, thus leading to imprecision in assessing the actual fault tolerance of the recovery scheme. Thus, efforts to select an optimal erasure code implementation for a particular system could be impeded. Further, uncertainty regarding the fault tolerance of a particular code can impact the manner in which data is allocated among various storage devices and/or communication channels. Such uncertainty could hamper a user's ability to optimally store and/or allocate data across storage devices. Similarly, such uncertainty also could hamper efforts to allocate and route data across communication network channels, inasmuch as those systems could not function as desired.

DETAILED DESCRIPTION

Figure 1:
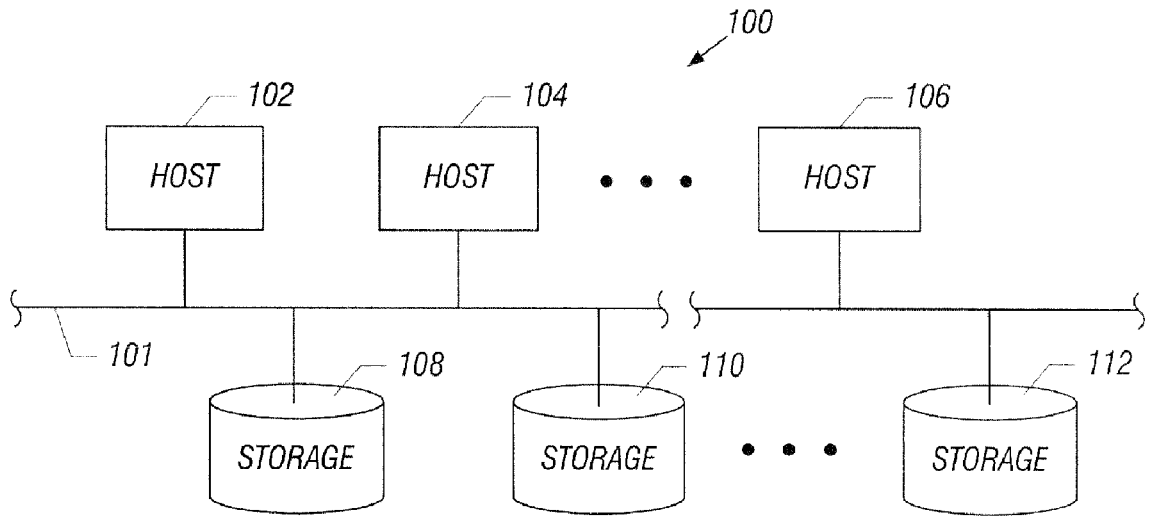
FIG. 1 illustrates a network of devices in accordance with an exemplary embodiment of the invention.

FIG. 1 illustrates an exemplary arrangement of a system of devices 100 which includes a plurality of computer hosts 102, 104, 106 and a plurality of storage devices 108, 110 and 112. In one embodiment, the hosts 102, 104, 106 and storage devices 108, 110 and 112 may be interconnected by a network 101. The network 101 may include, for example, a local area network (LAN), a wide area network (WAN), a storage area network (SAN), the Internet or any other type of communication link. In addition, the network 101 may include system buses or other fast interconnects. The system 100 shown in FIG. 1 may be any one of an application server farm, a storage server farm (or storage area network), a web server farm, a switch or router farm, etc. Although three hosts 102, 104, 106 and three storage devices 108, 110 and 112 are depicted in FIG. 1, it is understood that the system 100 may include more than three hosts and three storage devices, depending on the particular application in which the system 100 is employed. The hosts may be, for example, computers (e.g., application servers, storage servers, web servers, etc.), communications modules (e.g., switches, routers, etc.) and other types of machines. Although each of the hosts is depicted in FIG. 1 as being contained within a box, a particular host may be a distributed machine, which has multiple nodes that provide a distributed and parallel processing system.

As will be described below, an exemplary embodiment of the invention provides a method for determining the fault tolerance of erasure codes which, for example, can be used to communicate data between the hosts 102-106. By determining the fault tolerance, a measure can be provided for ranking the suitability of employing a particular erasure code with certain communication channels which, for example, are overloaded or are otherwise prone to failure. Alternatively, the measure of fault tolerance may be used to determine an optimal manner for storing the encoded information in the various storage devices 108-112. The measure of a code's fault tolerance is an indication of the extent to which the erasure coding scheme can recover compromised data.

The storage devices 108-112 are adapted to store data associated with the hosts 102-106. Each of the hosts 102-106 could be coupled to one or more of the storage devices 108-112, and each of the hosts 102-106 could access the storage devices 108-112 for storing and/or retrieving data from those devices. Each of the storage devices 108-112 could be an independent memory bank. Alternatively, the devices 108-112 could be interconnected, thus forming a large memory bank or a subcomplex of a large memory bank. The devices 108-112 may be, for example, magnetic memory devices, optical memory devices, flash memory devices, etc., depending on the particular implementation of system 100 in which the devices are deployed.

In an exemplary embodiment, a single erasure code can be implemented across the plurality of hosts 102-106 and/or the plurality of storage devices 108-112 to recover data that has become damaged, lost or otherwise compromised during transferring, storing and/or retrieving operations implemented by the hosts 102-106 and/or the storage devices 108-112. The present invention enables users to efficiently determine the fault tolerance of a particular erasure code as well as to efficiently rank a plurality of erasure codes by fault tolerance and, thus, to determine a more fault tolerant code or group of codes. As used herein, a "more" fault tolerant code is a code or group of codes having a fault tolerance that is greater than another code or group of codes. A more fault tolerant code may be a code or codes having the greatest fault tolerance of the group of codes or a code or codes having the "X"th greatest fault tolerance of the group of codes.

Although a single erasure code may be used with each device in the system 100, in some embodiments, each of the hosts 102-106 and/or storage devices 108-112 may use a different or a dedicated erasure code, each of which has its own fault tolerance. By providing techniques for efficiently determining the fault tolerance of an erasure code and for efficiently determining the more fault tolerant code(s) of a plurality of erasure codes and/or a ranking of fault tolerances, the efficient and reliable implementation of data allocation schemes for optimally storing data in each of the devices 108-112 can be accomplished. Moreover, by correlating the fault tolerances of a plurality of erasure codes with the reliability levels of the various devices deployed in the system 100, an allocation scheme could be fashioned whereby the more fault tolerant codes are used with the least reliable devices, thus again enhancing the robustness of the system 100 in terms of data recoverability.

Figure 2:
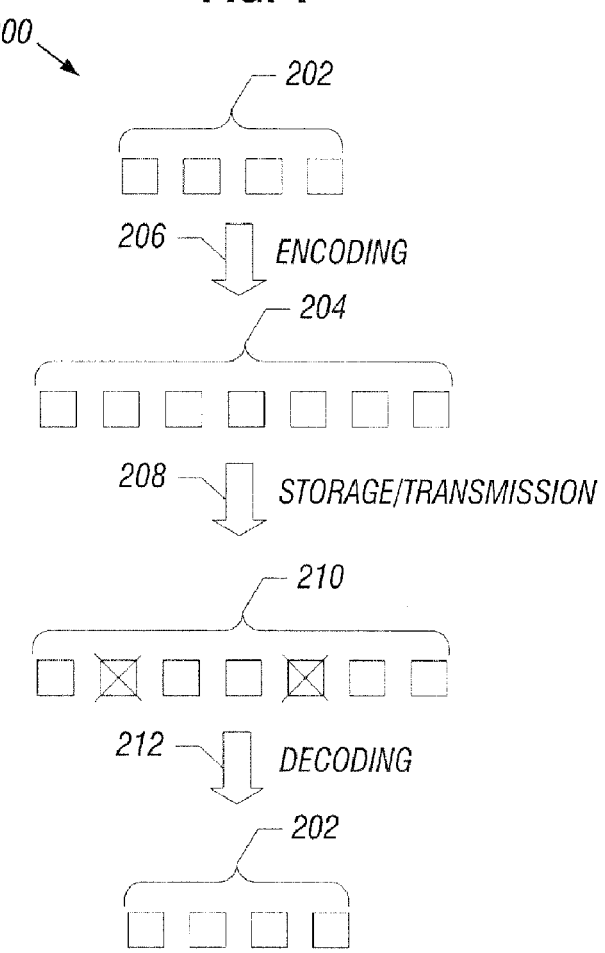
FIG. 2 illustrates encoding and decoding processes implemented by an erasure code in accordance with an exemplary embodiment of the invention.

FIG. 2 illustrates an erasure code encoding and decoding process 200 in accordance with an exemplary embodiment of the invention. The process 200 includes encoding and decoding steps performed by an erasure code for storing, retrieving and/or transferring data in the system 100. In accordance with one embodiment of the invention, the process 200 is implemented by a systematic erasure code, such as an XOR-based code, although other types of systematic erasure codes are contemplated. As illustrated in FIG. 2, an initial data set 202 is provided, which includes a string of bits, bytes, or other symbols representing storable, retrievable and/or transferrable data or other information used by the system 100. The erasure code encodes the initial data set 202 into an encoded data set 204, as represented by the arrow 206. The arrow 206 represents the transformation process, which generally involves creating redundancies within the original data set 202, thereby increasing its size to form the encoded data set 204. The particular transformation process 206 employed is based on the erasure code used and the particular implementation of the system 100.

After encoding, the data set 204 may be stored, retrieved, and/or transferred, as indicated by the arrow 208. For instance, arrow 208 could correspond to transmitting the data set 204 between individual computers or to a user retrieving data from a server. Alternatively, arrow 208 could correspond to data transfer, storage and/or retrieval operations occurring between the multiple communication and/or storage devices of the system 100. During the processes represented by arrow 208, the data set 204 could, for example, propagate through lossy communication channels or be stored in corrupted storage devices. Thus, some portion of the data set 204 could become lost or otherwise compromised, resulting in a degraded data set 210. As illustrated in FIG. 2, the data set 210 includes erasures (represented by the crossed-out portions), corresponding to those portions of the data set 204 which have been lost during the process 208. Depending on the erasure code used and the portions of the data lost, the original data set 202 may be recoverable.

To recover the initial data set 202, a decoding process (represented by arrow 212) is applied to the degraded data set 210. Again, the particular decoding process employed depends on the erasure code being implemented. As the ability to recover the data depends on the erasure code used and which portions of the encoded data set 204 were lost (i.e., the erasures), it may be possible that the initial data set 202 may not be recovered.

Patterns of erasures which lead to irrecoverable data loss relate to the fault tolerance of the erasure code. Systematic erasure codes, such as XOR-based codes, include n symbols, k of which are data symbols, and m of which are parity (or redundant) symbols. A set of erasures f refers to a set of erased symbols, either data symbols or redundant symbols. An erasure pattern is a set of erasures that results in at least one data symbol being irrecoverable (i.e., impossible to recover by any decoding method). An erasures list (EL) for an erasure code is a list of all of the code's erasure patterns. A minimal erasure is an erasure pattern for which every erasure is necessary for it to be an erasure pattern. That is, if any erasure is removed from a minimal erasure, then the minimal erasure is no longer an erasure pattern. A minimal erasures list (MEL) for an erasure code is the list of all of the code's minimal erasures. More compact representations of the EL and the MEL for a particular code are an erasures vector (EV) and a minimal erasures vector (MEV), respectively. An erasures vector EV is a vector of length m in which the ith element corresponds to the total number of erasure patterns of size i in the EL. Likewise, the minimal erasures vector MEV is a vector of length m in which the ith element is the total number of minimal erasure patterns of size i in the MEL. The EV and MEV need only m entries because all erasure sets greater than m in length necessarily are erasure patterns.

In an exemplary embodiment of the invention, analysis of a particular erasure code to determine its erasure patterns (and thus its fault tolerance) is facilitated using a generator matrix and a Tanner graph that correspond to the erasure code. As known in the art, a generator matrix of a (k, m)-code is a k×(k+m) matrix in a Galois field. Addition of rows and columns in the generator matrix is done modulo 2, that is, in accordance with the XOR operation. The generator matrix consists of a k×k data submatrix and m columns of dimension k×1 appended to the data submatrix as a parity submatrix.

Each of the m columns of the data submatrix corresponds to a stored data symbol. Likewise, each of the m columns in the parity submatrix corresponds to a stored parity symbol. A parity column p has a "1" in row i if and only if data symbol $s_i$ is XOR'ed to determine p. For example, if $p=s_2$ XOR $s_4$, the parity column p has a "1" in rows 2 and 4 and a "0" in all other rows. The erasure pattern induced by "1s" in the ith row of the generator matrix is referred to as the ith base erasure.

Figure 3:
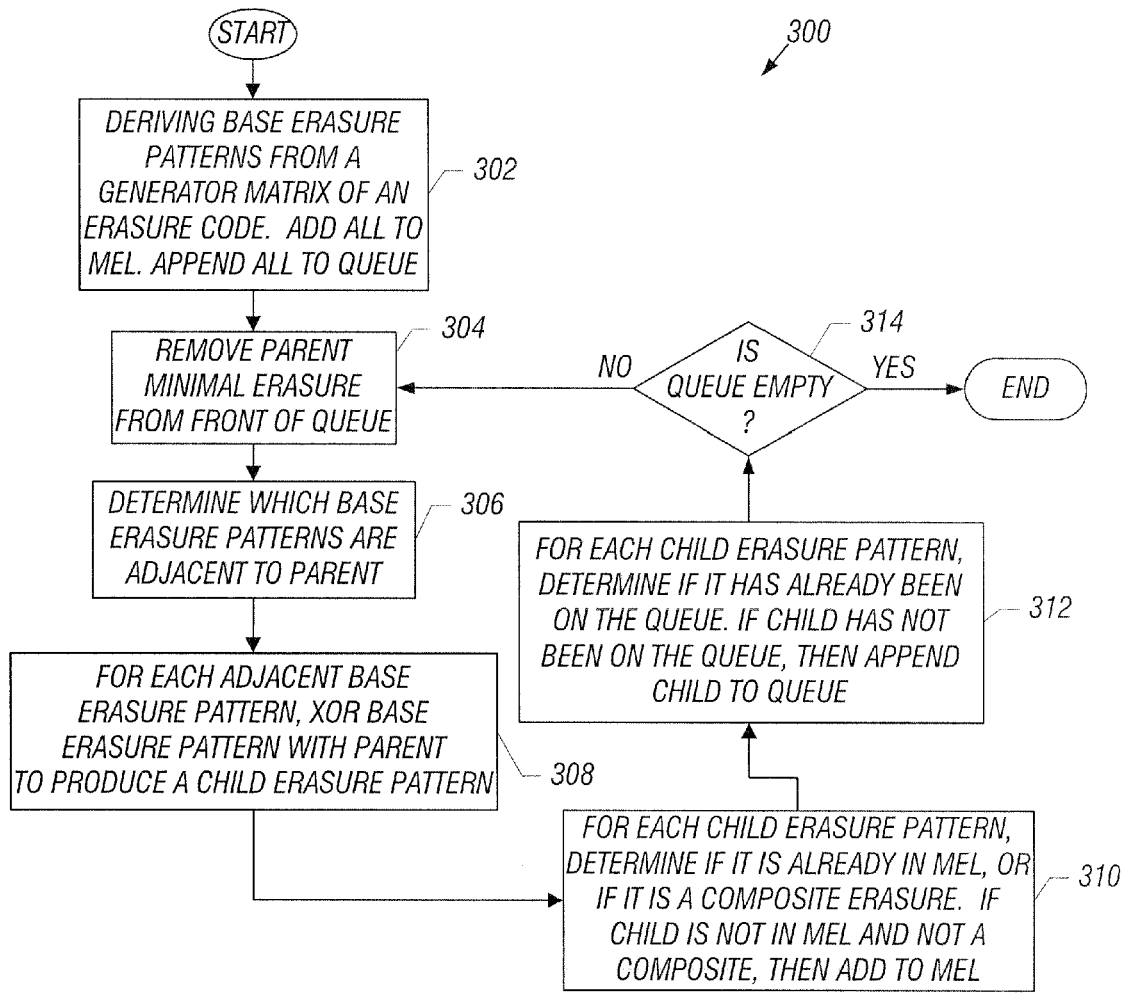
FIG. 3 is a flow diagram of a technique for determining the fault tolerance of an erasure code, in accordance with an exemplary embodiment of the invention.

FIG. 3 is a flowchart illustrating a technique 300 for determining the MEL of an XOR-based erasure code in accordance with an exemplary embodiment of the invention. Hereinafter, the technique 300 will be referred to as the minimal erasures technique. Using the generator matrix for a particular (k,m) erasure code, k base erasure patterns (one for each data symbol) of the erasure codes are derived/identified (block 302). The k base erasure patterns initially form a set of minimal erasures, which are referred to as parent minimal erasures, from which child erasures are further derived. All of the identified base erasures are added to the MEL and are thereafter appended to a queue. Next, at block 304, parent minimal erasures are removed from the queue. At block 306, the process 300 then determines which of the identified base erasure patterns are adjacent. Generally, a data symbol is considered to be adjacent to a minimal erasure if it is connected to a parity symbol in the minimal erasure. Stated otherwise, if two rows of a column of the parity submatrix have an entry of "1," then those two rows are considered adjacent.

Once the adjacent rows of the generator matrix are identified, those rows are XOR'ed with one another to produce child erasure patterns (block 308). Thus, for every minimal erasure found (i.e., for every parent erasure), a child erasure pattern for each adjacent row in the generator matrix is generated. Next, it is determined whether each of the generated child erasure patterns is already in the MEL or whether the child pattern is a composite erasure. Those skilled in the art will appreciate that a child erasure pattern is either a minimal erasure not yet in the MEL, a minimal erasure already in the MEL, or a composite erasure pattern. A composite erasure pattern is either a minimal erasure or the disjoint union of some minimal erasures. That is, a composite erasure pattern may be partitioned into minimal erasures. Accordingly, the child erasure patterns that either are not already in the MEL or are not composite erasure patterns are added to the MEL (block 310). Otherwise, a child erasure pattern generated at block 308 is not added to the MEL.

Next, it is determined whether those child erasure patterns that were added to the MEL at block 310 are already on the queue. If not, then the child erasure patterns are appended to the queue (block 312). If the queue on which previously generated erasure patterns were placed is not empty (diamond 314), then the technique 300 terminates. If the queue is not empty, then the process returns to block 304.

One implementation for generating the MEL according to the minimal erasures technique 300 is described in pending patent application Ser. No. 11/904,284, entitled "System and Method for Determining the Fault-Tolerance of an Erasure Code," filed Sep. 26, 2007. As one skilled in the art would recognize, other implementations of technique 300 also are possible.

The process 300 for generating an MEL for a particular XOR-based erasure code may be better understood with reference to the generator matrix below of an XOR-based code having k=4 and m=4. One possible generator matrix for such a code could be represented as:

$$\begin{matrix} s_1 & s_2 & s_3 & s_4 & p_1 & p_2 & p_3 & p_4 \end{matrix}$$
$$\begin{bmatrix} 1 & 0 & 0 & 0 & 1 & 0 & 0 & 1 \\ 0 & 1 & 0 & 0 & 1 & 1 & 1 & 1 \\ 0 & 0 & 1 & 0 & 0 & 1 & 1 & 0 \\ 0 & 0 & 0 & 1 & 0 & 0 & 1 & 1 \end{bmatrix} \begin{matrix} \hat{f}_{s1} \\ \hat{f}_{s2} \\ \hat{f}_{s3} \\ \hat{f}_{s4} \end{matrix}$$

Table 1 below summarizes the execution of the technique 300 as applied to the above generator matrix:

TABLE 1

| Q.dequeue | f̂ | M |
|---|---|---|
|  | $(s_1, p_1, p_4)$ | ✓ |
|  | $(s_2, p_1, p_2, p_3, p_4)$ | ✓ |
|  | $(s_3, p_2, p_3)$ | ✓ |
|  | $(s_4, p_3, p_4)$ | ✓ |
| $(s_1, p_1, p_4)$ | $(s_1, s_2, p_2, p_3)$ | ✓ |
|  | $(s_1, s_4, p_1, p_3)$ | ✓ |
| $(s_2, p_1, p_2, p_3, p_4)$ | $(s_1, s_2, p_2, p_3)$ | x |
|  | $(s_2, s_3, p_1, p_4)$ | ✓ |
|  | $(s_2, s_4, p_1, p_2)$ | ✓ |
| $(s_3, p_2, p_3)$ | $(s_2, s_3, p_1, p_4)$ | x |
|  | $(s_3, s_4, p_2, p_4)$ | ✓ |
| $(s_4, p_3, p_4)$ | $(s_1, s_4, p_1, p_3)$ | x |
|  | $(s_2, s_4, p_1, p_2)$ | x |
|  | $(s_3, s_4, p_2, p_4)$ | x |
| $(s_1, s_2, p_2, p_3)$ | $(s_1, s_2, s_3)$ | ✓ |
|  | $(s_1, s_2, s_4, p_2, p_4)$ | ✓ |
| ... | ... | ... |
| ... | ... | ... |

The first column of Table 1 lists the erasure pattern being processed. The second column lists the children of the corresponding base pattern. The third column indicates (via a checkmark) whether the child erasure pattern is inserted into the MEL and enqueued in the queue. The first four rows of the table illustrate the base erasures determined initially from the generator matrix and placed in the queue. The remaining rows of Table 1 illustrate the children generated by dequeuing the erasure patterns. These rows further indicate which child patterns are inserted into the MEL according to the criteria described above with reference to FIG. 3. The ellipsis at the bottom of Table 1 indicates that the minimal erasures algorithm continues for some number of iterations before terminating.

From Table 1, it can be seen that the MEL for the erasure code characterized by the above generator matrix includes the following minimal erasures: [$(s_1, p_1, p_4)$, $(s_3, p_2, p_3)$, $(s_4, p_3, p_4)$, $(s_1, s_2, s_3)$, $(s_1, s_2, p_2, p_3)$, $(s_2, s_3, p_1, p_4)$, $(s_2, s_4, p_1, p_2)$, $(s_2, s_3, p_1, p_4)$, $(s_3, s_4, p_2, p_4)$]. Accordingly, for the above matrix, any f longer than m=4 is elided from the MEL. Further, an MEV characterizing the MEL is given as (0, 0, 4, 5), signifying that the erasure code has no minimal erasures of size m=1 or m=2; four minimal erasures of size m=3; and five minimal erasures of size m=4.

Figure 4:
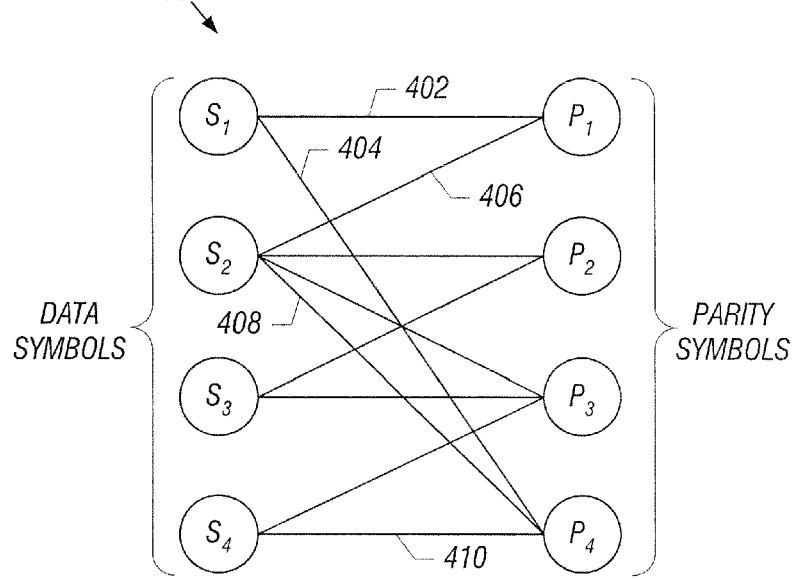
FIG. 4 is a Tanner graph representing an erasure code in accordance with an exemplary embodiment of the invention.

In addition to the generator matrix described above, a Tanner graph also may be generated to facilitate the determination of an MEL for a particular erasure code. A Tanner graph is a bipartite graph with k data nodes on one side, m data symbols on the other side, and a plurality of edges interconnecting the data symbols and parity symbols in accordance with the structure of the erasure code. A Tanner graph 400 that represents the structure of the erasure code described by the above generator matrix is illustrated in FIG. 4. For instance, for the first minimal erasure pattern corresponding to ($s_1$, $p_1$, $p_4$), edges 402 and 404 connect data node $s_1$ to parity nodes $p_1$ and $p_4$, respectively. The Tanner graph may be used to determine adjacencies of rows of the generator matrix. From the Tanner graph illustrated in FIG. 4, it can be seen that symbols $s_2$ and $s_4$ are adjacent the erasure pattern $(s_1, p_1, p_4)$ since parity node $p_1$ also is connected to data node $s_2$ by edge 406 and parity node $p_4$ also is connected to data node $s_2$ and $s_4$ by edges 408 and 410, respectively. Those skilled in the art will appreciate that additional adjacencies can be derived in a similar manner so as to facilitate computations leading to the erasure patterns set forth in Table 1 from which the MEL for the erasure code is derived.

Once the list of minimal erasures MEL is determined, the MEL may be succinctly expressed as a minimal erasures vector MEV. Likewise, the list of erasure patterns EL for a particular code also may be expressed as an erasures vector EV. Typically, the EL is a superset of the MEL. A list of composite erasures (i.e., a CEL) also may be generated, and the CEL for a particular code may be expressed as a composite erasures vector CEV.

Generally, the EV and the MEV are written as $(j_1 \ldots j_m)$, where $j_i$ is the number of (minimal) erasure patterns of size i. The first non-zero entry, $j_i$, in the MEV and the EV for a particular code are identical and indicate that the code's Hamming distance is i. The Hamming distance of a code is an indicator of the fault tolerance of the code. For instance, for systematic codes, such as XOR-based erasure codes, a Hamming distance of 4 (i.e., the first non-zero entry in the erasures vector is $j_4$) means that there exists some set of four erasures that will result in nonrecoverable data. However, not all sets of four erasures are nonrecoverable. Thus, a systematic code having a Hamming distance of 4 necessarily can tolerate at least three erasures (i.e., erasures of size i−1).

Because the Hamming distance may be determined from the erasure vector, EVs or MEVs can be compared by comparing shortest to longest vector values (i.e., from 1 to m) to determine which code is more fault tolerant. For example, if EV1=(0, 4, 5) and EV2=(0, 0, 10), then the Hamming distance of EV1 is 2 and the Hamming distance of EV2 is 3. Accordingly, since the code corresponding to EV1 can only tolerate at least one erasure and the code corresponding to EV2 can tolerate at least two erasures, then the code corresponding to EV2 is more fault tolerant. As another example, if EV1=(0, 4, 5) and EV3=(0, 4, 4), then both codes have a Hamming distance of 2. The erasure vectors further indicate that both codes have four erasure patterns of size 2. Thus, at this point in the comparison, the fault tolerance of the two codes appears to be equivalent. However, when the third vector values are compared, it can be seen that the code corresponding to EV1 has five erasure patterns of size 3, while the code corresponding to EV3 has only four erasure patterns of size 3. Since EV3 has fewer erasure patterns of size 3, then the code corresponding to EV3 is more fault tolerant than the code corresponding to EV1. MEVs can be compared in a similar fashion. For two codes having the same k and m, comparing the MEVs of the erasure codes is equivalent to comparing those codes' EVs. For two codes that differ in k and/or m, the result of comparing the MEVs of the codes is only necessarily the same as the result of comparing their EVs if those codes have different Hamming distances. The results of the comparison also will be the same if the codes have the same Hamming distance, but have different vector values at the Hamming distance.

Using the minimal erasures technique shown in FIG. 3, including the generator matrices and Tanner graphs described above, the fault tolerance of a particular erasure code of size (k, m) may be efficiently derived. Use of the minimal erasures technique, along with the generator matrices and Tanner graphs, may also be extended to efficiently determine and compare the fault tolerance of a plurality of same size (k, m) codes so that the more fault tolerant code(s) of size (k, m) may be determined and/or a fault tolerance ranking of the plurality of same size (k, m) codes may be derived. Hereinafter, the group of codes having the same k, m will be referred to as a code corpus. Generally speaking, determining the more fault tolerant code for a given (k, m)-code corpus is computationally difficult because the number of such codes grows exponentially (i.e., there are $2^{k(k+m)}$ possible such codes) and because known methods of determining fault tolerance involve an exponential number of matrix inversions per code (i.e., up to $2^{(k+m)}$ matrix inversions).

Figure 5:
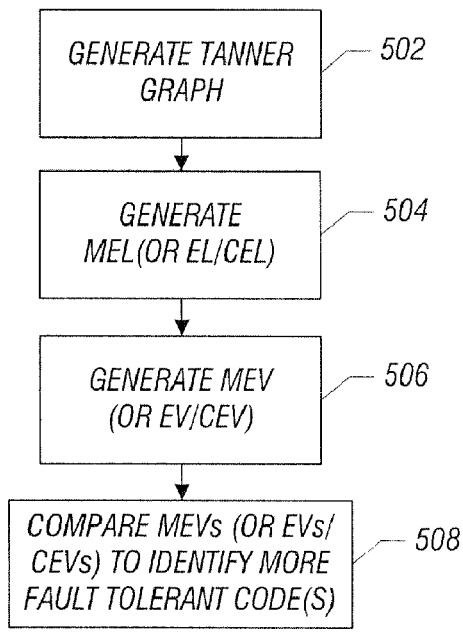
FIG. 5 is a flow diagram of a technique for efficiently comparing the fault tolerances of a plurality of erasure codes in accordance with an exemplary embodiment of the invention.
Figure 6:
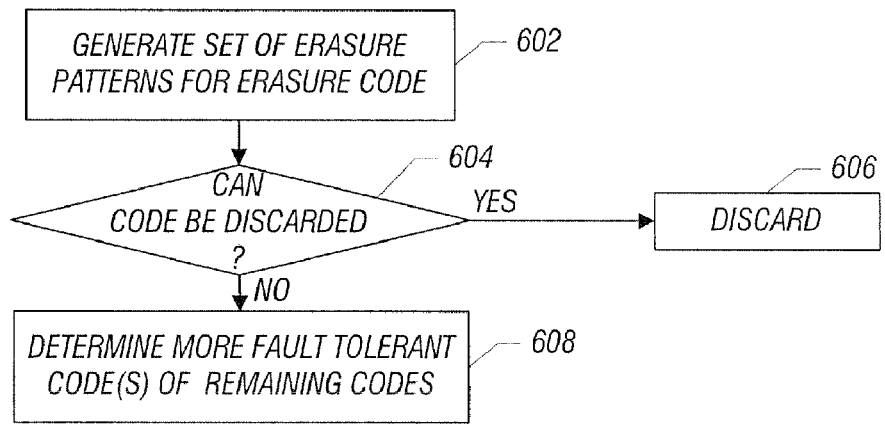
FIG. 6 is a flow diagram of a technique for discarding erasure codes from the fault tolerance analysis, in accordance with an exemplary embodiment of the invention.

For example, to find the more fault tolerant code(s) from a given k and m, every possible code could be evaluated. To enumerate all possible systematic XOR-based erasure codes, every possible combination of ones and zeroes can be enumerated for the non-systematic k×(k+m) portion of the generator matrix. The bitmap representations of the integers from 0 to $2^{k(k+m)}-1$ can be used to enumerate all such possibilities. According to an exemplary embodiment of the invention, and as shown in FIG. 5, the computational intensity of finding the more fault tolerant code(s) can be reduced by using the minimal erasures technique 300 described above to generate the MEL (or EL or CEL) for a given code (block 504) from the Tanner graph that has been generated and which is representative of the code (block 502). Based on the MEL (or EL or CEL), the MEV (or EV or CEV) may be derived (block 506). The erasure vectors for each code can then be compared to find the more fault tolerant code(s) (or the "X"th more fault tolerant code(s)) in the (k, m)-code corpus (block 508). As will be described below, the efficiency of this computational task may be further enhanced through extensions of the minimal erasures technique that allow it to efficiently process large numbers of codes by recognizing and discarding "bad" codes (i.e., codes that either are not or cannot be the more fault tolerant code(s)) prior to completely determining the code's MEV (or EV or CEV). Thus, as shown in the flow diagram of FIG. 6, the minimal erasures technique 300 is used to generate a set of erasure patterns for the erasure codes in a (k, m)-code corpus (block 602). Based on the erasure patterns, bad codes may be identified and discarded from further evaluation (diamond 604 and block 606). The fault tolerance of the remaining codes may then be determined (e.g., by generating and comparing erasure vectors) and the more fault tolerant code (s) identified (block 608).

So-called "bad" codes also can be easily discarded by taking into account certain characteristics of the Tanner graphs that describe systematic erasure codes. By examining these characteristics, a preferred set of Tanner graphs can be readily identified, which, in turn, will significantly reduce the number of codes in the code corpus which will participate in the fault tolerance evaluation. For instance, as recognized by one of skill in the art, for a group of systematic erasure codes of the same size (k, m), the corresponding Tanner graphs may be either isomorphic or non-isomorphic. Isomorphic Tanner graphs are graphs that have the same structural properties. Thus, isomorphic graphs in effect describe the same erasure code, the only difference being in the labels attached to the different data and parity nodes. Constraining the analysis to only non-isomorphic graphs thus ensures that each graph considered describes a different erasure code. Thus, according to an exemplary embodiment of the invention, and as illustrated in the flow diagram of FIG. 7, a Tanner graph for each erasure code in the corpus is generated (block 702). If the Tanner graph is isomorphic with respect to another Tanner graph in the corpus, then the erasure code is discarded from further consideration (diamond 704 and block 706), thus obviating the need to generate an erasure vector for comparison with the erasure vectors of the other codes in the corpus. Considering only non-isomorphic Tanner graphs reduces the number of codes in a corpus considerably. For example, for the (7,7)-code corpus, the reduction is greater by a factor exceeding 19 million.

Another constraint to reduce the computational complexity is to consider only connected Tanner graphs. A connected Tanner graph is a graph in which every node can be reached by traversing the edges of the graph starting from any one node. As would be recognize by one of skill in the art, for every disconnected Tanner graph of a given size (k, m), there necessarily is a connected Tanner graph having the same size (k, m) that is more fault tolerant. Thus, any disconnected Tanner graph also may be discarded and not further considered when trying to find the more fault tolerant code in the code corpus (diamond 708 and block 706).

Figure 8:
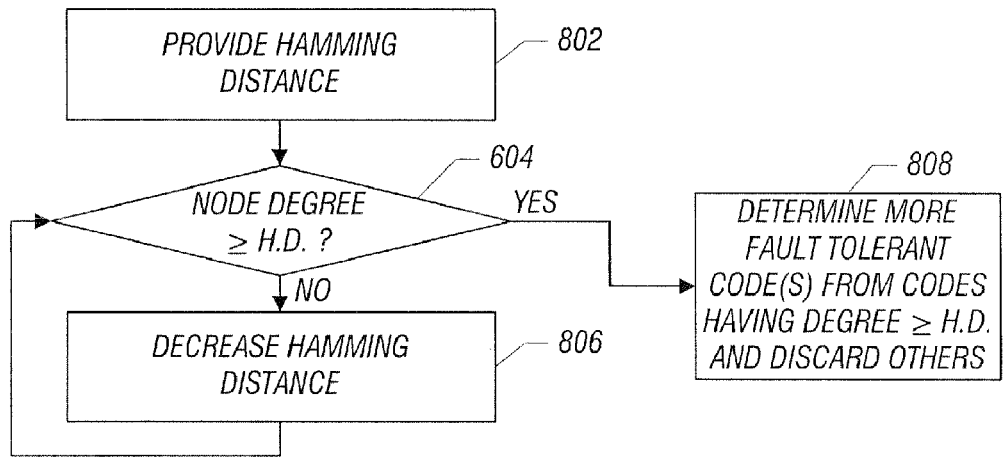
FIG. 8 is a flow diagram of a technique for reducing the number of Tanner graphs by considering the node degree, in accordance with an exemplary embodiment of the invention.
Figure 7:
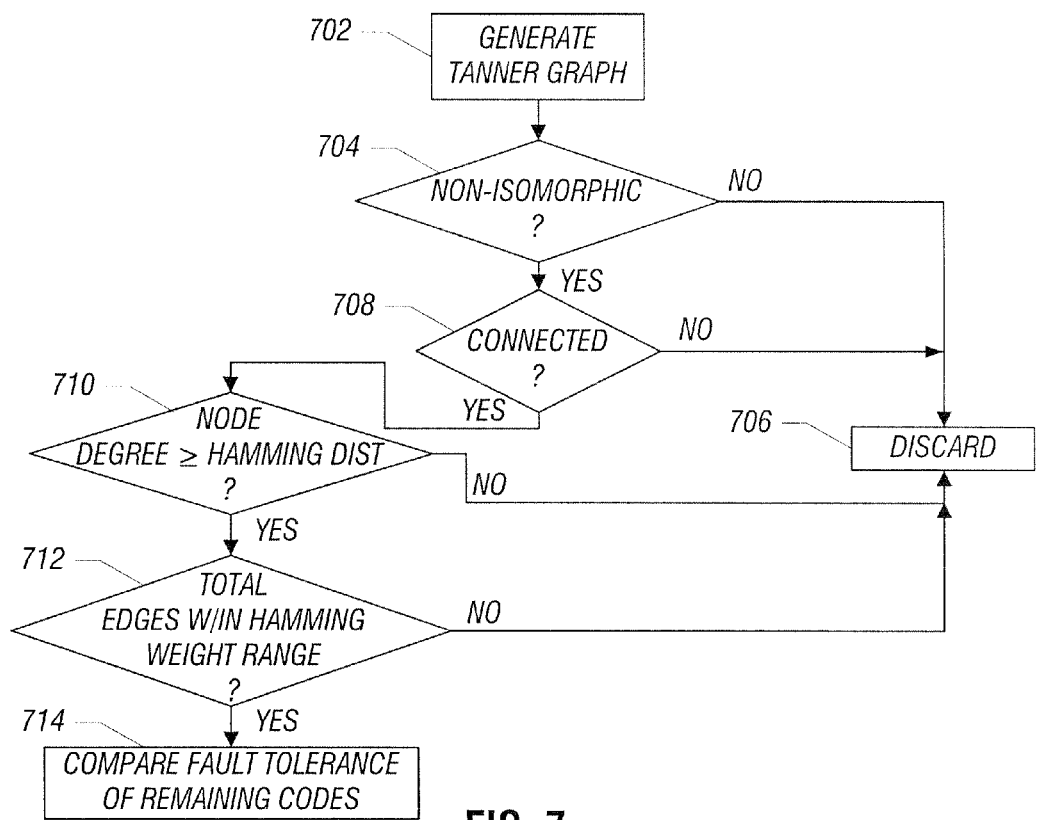
FIG. 7 is a flow diagram of a technique for reducing the number of Tanner graphs considered in the fault tolerance analysis, in accordance with an exemplary embodiment of the invention.

In addition to restricting the fault tolerant analysis to considering only codes having connected, non-isomorphic Tanner graphs, the evaluation of this restricted set of codes may be further facilitated based on an estimated Hamming distance of the code. As discussed previously, the Hamming distance of a code is an indicator of the fault tolerance of the code. In a Tanner graph, the degree d of a node corresponds to the number of edges emanating from that node, and a symbol node of degree d necessarily has a minimal erasure of size d+1. Thus, for example, in the Tanner graph shown in FIG. 4, data node $s_1$ has a degree of 2 and a minimal erasure of size 3 (e.g., s1, p1, p4), while data node $s_2$ has a degree of 4 and a minimal erasure of size 5 (e.g., s2, p1, p2, p3, p4). For any systematic code having m parity symbols, the maximum degree of a symbol node is m. Thus, the best possible Hamming distance for the code can be no more than m+1. If the Hamming distance for a code is m+1, then all symbol nodes in the Tanner graph must be connected to at least m parity nodes. Accordingly, and as shown in FIGS. 7 and 8, to reduce the number of Tanner graphs that must be evaluated, the analysis may start by providing a current estimated Hamming distance (of m+1, for instance) (block 802). If no Tanner graphs having all symbol nodes with a degree equal to or greater than the current estimated Hamming distance are found (diamond 804), then the Hamming distance may be decreased (e.g., to "m") (block 806) and the Tanner graphs may again be easily examined to determine which, if any, have all symbol nodes with a degree of at least m (return to diamond 804). This process may be repeated until one or more Tanner graphs are found which have symbol nodes having a degree of at least the current estimated Hamming distance. These graphs necessarily must be a best, or preferred, set of graphs in that they must represent the erasure codes of the corpus which potentially are the more fault tolerant, and only the codes corresponding to this preferred set of graphs need be evaluated to identify the more fault tolerant code(s) (block 808). Accordingly, the codes corresponding to the remaining Tanner graphs may then be discarded from further evaluation in the fault tolerance comparison (diamond 710 and block 706).

Figure 9:
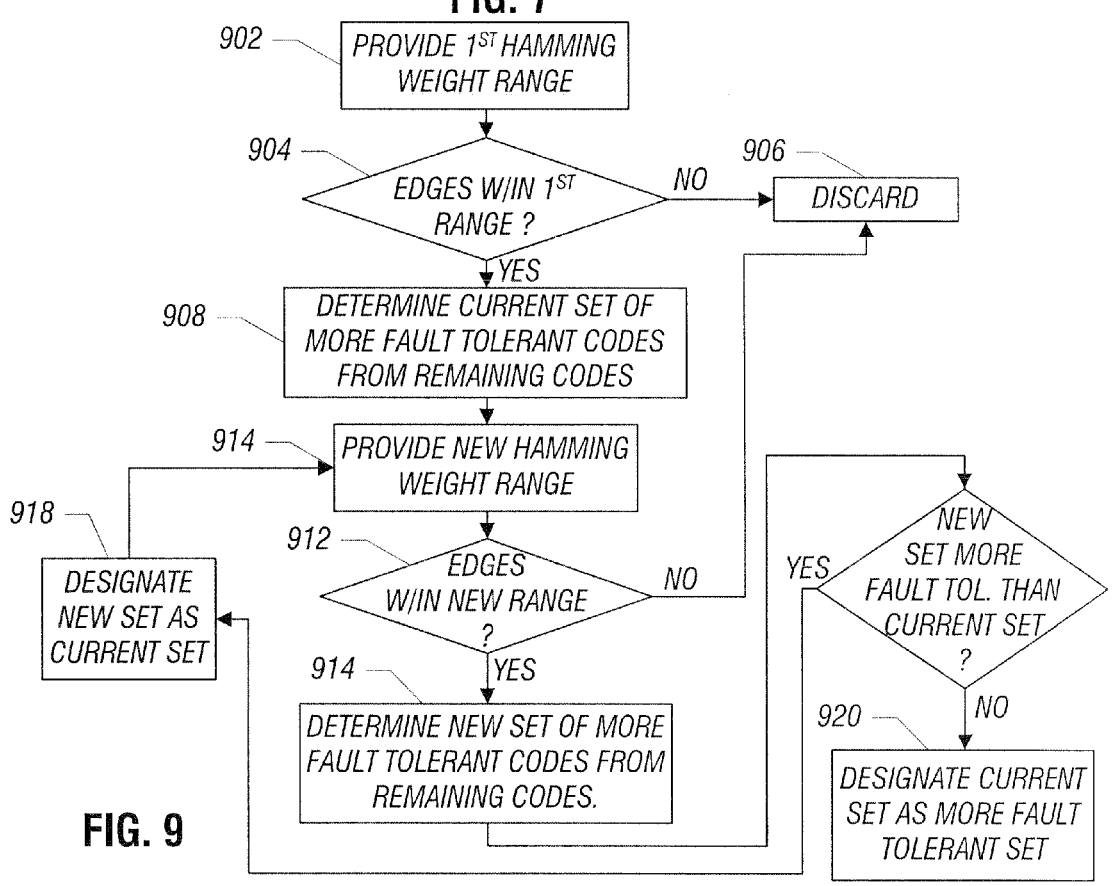
FIG. 9 is a flow diagram of a technique for reducing the number of Tanner graphs by considering the Hamming weight, in accordance with an exemplary embodiment of the invention.

An additional limitation that may be used to reduce the number of Tanner graphs considered when finding the more fault tolerant code is to restrict the codes evaluated based on Hamming weights. The Hamming weight corresponds to the number of edges in a Tanner graph. It has been found through heuristics that generally the more fault tolerant codes of the group of same size (k, m) codes will fall within a limited range of Hamming weights. Thus, as illustrated in FIGS. 7 and 9, by starting with an estimate of a range of Hamming weights for the more fault tolerant codes (block 902 in FIG. 9), erasure codes corresponding to Tanner graphs falling within a selected Hamming weight range may first be evaluated for fault tolerance (diamond 904) and the others discarded at least temporarily (block 906). A more fault tolerant code(s) from the codes having Tanner graphs within the Hamming weight range then may be determined (block 712; block 908). A new Hamming weight range may then be provided (e.g., a different range, an expanded range, etc.) (block 910) and the process repeated (diamond 912 and block 914). If a new code(s) having a greater fault tolerance then the previously determined more fault tolerant code(s) is found (diamond 916), then the new code(s) is designated as the current more fault tolerant code(s) (block 918) and a new Hamming weight range again is provided (block 910). This process is repeated until no better (i.e., more fault tolerant) erasure code(s) is found and the current more fault tolerant code(s) is designated as the more fault tolerant code(s) (block 920). Thus, this constraint again serves to decrease the computational complexity by terminating consideration of further Tanner graphs outside of the range of Hamming weights in which the more fault tolerant codes reside.

To further speed up the computational process, generation and evaluation of the Tanner graphs for the code corpus may be performed in parallel rather than serially. That is, multiple codes can be evaluated in parallel. The more fault tolerant code(s) found within each subgroup of codes evaluated can then be compared with the more fault tolerant codes of the other subgroups to determine the more fault tolerant code(s) overall.

Any one of or a combination of the characteristics of the Tanner graphs discussed above may be taken into consideration when restricting the number of codes that will be evaluated for fault tolerance. For instance, all connected, non-isomorphic Tanner graphs may be considered regarding node degree or Hamming weight. Alternatively, only the node degree or only the Hamming weight may be taken into consideration when sorting out the preferred Tanner graphs. Other characteristics of the Tanner graphs also may be taken into consideration, such as the distribution of degree over the symbol nodes, parity nodes, or both symbol and parity nodes.

Evaluating Tanner graph characteristics is but one technique for enhancing the overall computational efficiency of finding the more fault tolerant erasure code(s). In lieu of or in addition to Tanner graph evaluation, certain extensions of the minimal erasures technique 300 may be implemented that may further enhance the computational efficiency. These extensions generally involve recognizing when execution of the minimal erasures technique 300 itself may terminate "early" (i.e., at any point before the fault tolerance of the code under evaluation is finally determined). For instance, in some embodiments of the invention, a decision can be made to terminate the computation of any code "C" when it becomes apparent that the fault tolerance of code "C" necessarily is worse than the more fault tolerant code(s) (or the "X"th more fault tolerant code(s)) found so far in the computational process. Thus, with reference back to FIG. 6, the set of erasure patterns generated at block 602 may only be a subset of the complete erasure list since, for instance, only the subset need be generated to identify the more fault tolerant code(s) or some erasure pattern has been generated that indicates that the current code "C" cannot be the more fault tolerant code.

One or more different factors which indicate that a current code "C" under evaluation will not be the more fault tolerant code may be considered in deciding whether to terminate evaluation of the code "C". The Hamming distance may be one of these factors. For instance, if any minimal erasure for code "C" of a length less than the Hamming distance that corresponds to either an estimated Hamming distance or the Hamming distance of the current more fault tolerant code(s) (or "X"th more fault tolerant code(s)) is found, then further consideration of code "C" may be terminated. As an example, if the Hamming distance of the current more fault tolerant code identified is 4, then if a minimal erasure of length 3 for code "C" is found, code "C" cannot be more fault tolerant. Thus, no further erasure patterns need to be identified by the minimal erasures technique and the code may be discarded from further evaluation.

Similarly, given an MEV* for the more fault tolerant code found so far, if comparison of the MEV being generated for the current code "C" indicates that code "C" cannot be more fault tolerant, then code "C" again may be discarded. For instance, if the MEV* for the current more fault tolerant code has three minimal erasures of length 3, as soon as a fourth minimal erasure of length 3 is found for code "C", then further evaluation of code "C" may be terminated.

Parallel processing of subgroups of codes within the code corpus also can provide an avenue for early termination of consideration of certain codes. For instance, the MEV* (i.e., the MEV for the current more fault tolerant code) for each subgroup periodically may be communicated to the other groups so that each subgroup can adjust its MEV* or terminate evaluation of certain codes accordingly.

Figure 10:
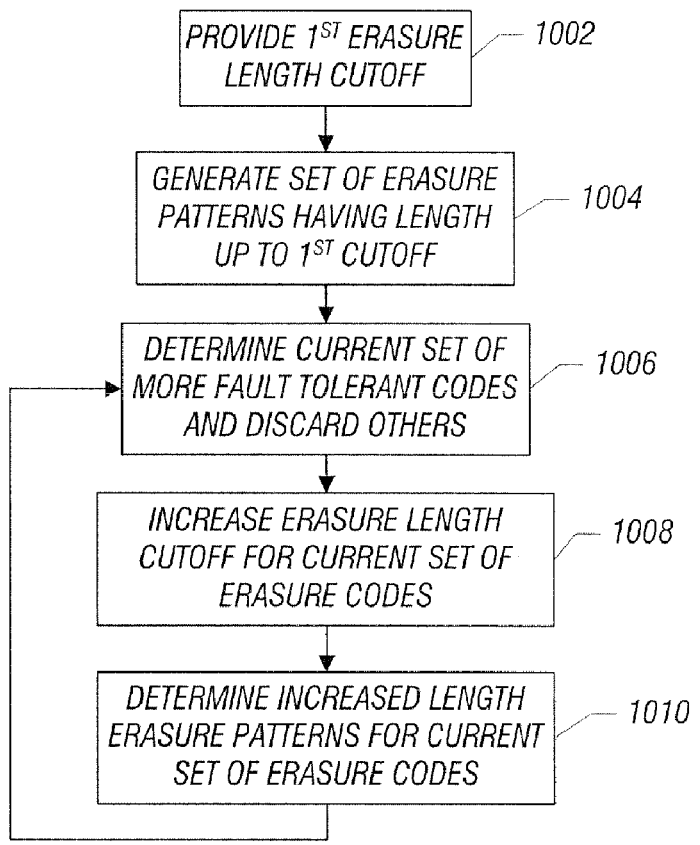
FIG. 10 is a flow diagram of a technique for reducing the computational complexity of the technique shown in FIG. 3, in accordance with an exemplary embodiment of the invention.

Efficiency of the processing of the corpus of codes may be improved in yet other manners as well. In accordance with one embodiment of the invention, and as illustrated in the flow diagram of FIG. 10, processing efficiency is further improved by performing multiple passes of the minimal erasures technique over the code corpus, with each successive pass enumerating the erasure vector for each code to a higher fidelity or, alternatively, only enumerating the erasure vector up to a selected fidelity or a fidelity cutoff. For instance, given MEV1=(0,0,3,5,6) and MEV2=(0,0,2,4,6), it is sufficient to only evaluate MEV1 and MEV2 up to the third entry to determine that MEV2 is more fault tolerant than MEV1. Thus, the minimal erasures technique 300 can be modified such that, on the first pass through the code corpus, it only determines a subset of erasures up to a specified length (blocks 1002 and 1004), such as a length of 3, since it generally is computationally quicker to determine erasures having shorter lengths than it is to determine those having longer lengths. This subset of limited-length erasures may then be used to generate a partial erasure vector and a set of more fault tolerant erasure codes may be determined by comparing the partial erasure vectors (block 1006). In addition, by establishing an erasure length cutoff, some of the codes in the corpus may be discarded from consideration without having to completely determine their complete erasure list and complete erasure vector because only the more fault tolerant set of erasure codes need be subjected to further evaluation. Thus, for the next pass over the code corpus, a longer erasure length cutoff may be provided for only the current set of more fault tolerant codes (block 1008). For instance, if the erasure length cutoff for the previous pass was for erasures having up to a length of 3, then on the next pass through the now-reduced corpus, the erasures technique need only determine erasures having up to a length of 4 (block 1010) for the reduced number of codes. The technique may then return to block 1006 and repeat the process of determining a set of more fault tolerant code(s) and discarding the others, thus once again resulting in a reduced number of codes to further evaluate for fault tolerance.

As discussed previously, the minimal erasures technique 300 is configured to identify erasure patterns and, from those erasure patterns, determine which of the patterns are minimal erasures. In one embodiment of the invention, the minimal erasures technique may be configured to not test the identified erasure patterns for minimality with the result that a composite erasures list (CEL) will be generated rather than an MEL. The CEL is a superset of the MEL in which some of the entries are the union of multiple non-intersecting minimal erasures. For instance, for the minimal erasures $(s_1, p_1, p_4)$ and $(s_3, p_2, p_3)$, the corresponding composite erasure is $(s_1, s_3, p_1, p_2, p_3, p_4)$. To determine whether an erasure pattern is a minimal erasure or a composite erasure, either a matrix rank test must be performed, or the erasure pattern must be compared to entries in the minimal erasures list to determine if any are a subset of it. Both the matrix rank test and the comparison test are computationally intensive. Thus, doing away with the need for the minimal erasures technique to actually test for minimality is yet another manner in which computational efficiency may be improved.

Figure 11:
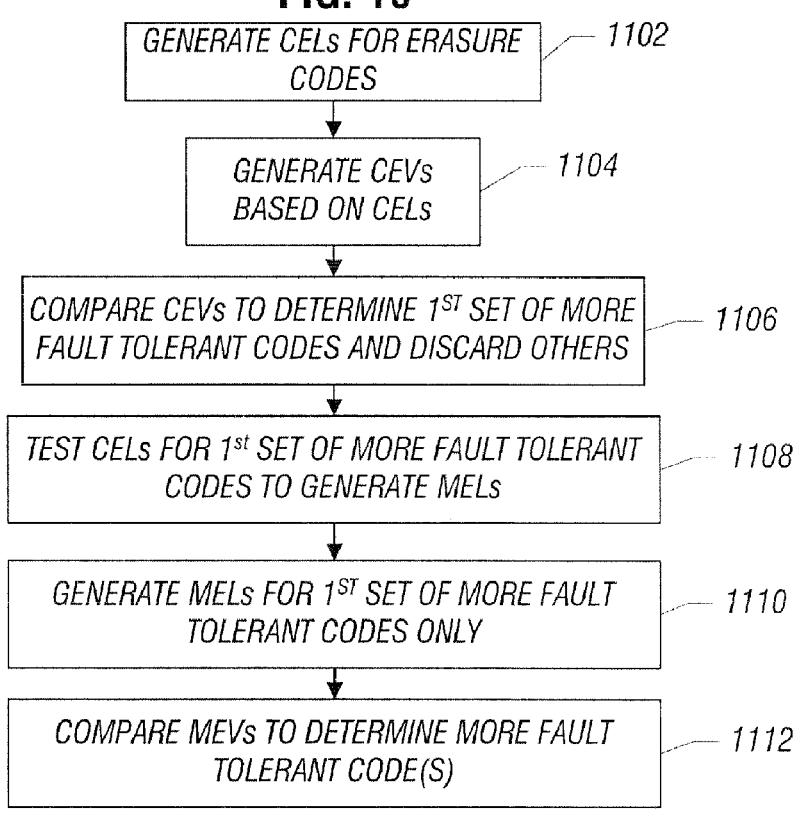
FIG. 11 is a flow diagram of another technique for reducing the computation complexity of the technique shown in FIG. 3, in accordance with an exemplary embodiment of the invention.

Thus, for instance, in accordance with one embodiment of the invention, and as illustrated in the flow diagram of FIG. 11, computational efficiency may be increased by performing a first pass over the code corpus that results in a CEL for each code considered (block 1102). The corresponding CEVs for the CELs may then be generated (block 1104) and compared for fault tolerance to determine a first set of more fault tolerant codes (block 1106). As would be recognized by one of skill in the art, the comparison of CEVs will induce a partial order on the codes that is consistent with the order when the MEV is used in the comparison. The first pass in which CELs are generated and CEVs compared thus will allow some number of codes to be discarded. A second pass over the remaining codes (i.e., the first set of more fault tolerant codes) in the corpus may then be performed in which the MELs (e.g., the CELs of the first set of more fault tolerant codes are tested for minimality) and corresponding MEVs are determined (blocks 1108 and 1110). The MEVs may then be compared to finally determine the more fault tolerant code(s) (block 1112).

The number of codes considered when generating the CELs and CEVs also may be reduced by estimating a Hamming distance. Given an estimated Hamming distance of d, then only erasure patterns of size 2d may be composite erasures. Accordingly, for any given code, only erasure patterns of size 2d may be subjected to the composite test, again improving the computational efficiency. Indeed, for many code corpi (e.g., k=14, m=5 with d=3), no composite tests need be performed at all.

Further extensions also may be implemented with the minimal erasures technique 300 that may either enhance computational efficiency and/or take into account other factors when determining which code will be selected for use in a fault tolerant system. For instance, the selected code may be the more fault tolerant code as discussed above. Alternatively, the selected code may have other characteristics in addition to fault tolerance. Such other characteristics may include, for example, the code's weight, low small write cost, efficient recovery of lost symbols, etc.

An exemplary evaluation of the fault tolerance of an XOR-based erasure code using the technique 300 is provided in Table 2 below. The evaluation was applied to all (k, m)-code corpi for $2 \leq m \leq k \leq 7$.

TABLE 2

| k | m | # in corpus | A parity submatrix w MEV* | MEV* | d* |
|---|---|---|---|---|---|
| 2 | 2 | 3 | 1, 3 | (0, 1) | 2 |
| 3 | 2 | 5 | 3, 5 | (0, 2) | 2 |

TABLE 2-continued

| k | m | # in corpus | A parity submatrix w MEV* | MEV* | d* |
|---|---|---|---|---|---|
| 3 | 3 | 17 | 3, 5, 6 | (0, 0, 4) | 3 |
| 4 | 2 | 8 | 7, 11 | (0, 3) | 2 |
| 4 | 3 | 42 | 7, 11, 13 | (0, 0, 7) | 3 |
| 4 | 4 | 179 | 7, 11, 13, 14 | (0, 0, 0, 14) | 4 |
| 5 | 2 | 11 | 7, 27 | (0, 5) | 2 |
| 5 | 3 | 91 | 7, 11, 29 | (0, 1, 10) | 2 |
| 5 | 4 | 633 | 7, 11, 19, 29 | (0, 0, 4, 14) | 3 |
| 5 | 5 | 3835 | 7, 11, 19, 29, 30 | (0, 0, 0, 10, 16) | 4 |
| 6 | 2 | 15 | 15, 51 | (0, 7) | 2 |
| 6 | 3 | 180 | 7, 27, 45 | (0, 2, 14) | 2 |
| 6 | 4 | 2001 | 7, 27, 45, 56 | (0, 0, 8, 18) | 3 |
| 6 | 5 | 20755 | 7, 25, 42, 52, 63 | (0, 0, 0, 25, 0) | 4 |
| 6 | 6 | 200082 | 7, 27, 30, 45, 53, 56 | (0, 0, 0, 6, 24, 16) | 4 |
| 7 | 2 | 19 | 31, 103 | (0, 9) | 2 |
| 7 | 3 | 328 | 15, 51, 85 | (0, 3, 19) | 2 |
| 7 | 4 | 5745 | 15, 54, 90, 113 | (0, 0, 12, 26) | 3 |
| 7 | 5 | 102089 | 7, 57, 90, 108, 119 | (0, 0, 0, 38, 0) | 4 |
| 7 | 6 | 1781941 | 7, 46, 56, 75, 85, 118 | (0, 0, 0, 14, 28, 24) | 4 |
| 7 | 7 | 29610804 | 7, 27, 45, 51, 86, 110, 120 | (0, 0, 0, 3, 24, 36, 16) | 4 |

The first two columns of Table 2 list k and m for each code corpus. The third column lists the number of codes in the (k, m)-code corpus. The fourth column of Table 2 lists a parity submatrix for a code from the corpus that has an MEV equal to MEV*. The parity submatrix is in bitmap representation, whereby each integer represents a column of the parity submatrix (i.e., if the parity symbol includes data symbol $s_j$, then add $2^{j-1}$ to the integer representation). For example, for the (4,3)-code corpus, "7, 11, 13" means that the first parity is the XOR of s1, s2 and s3. The second parity is the XOR of s1, s2 and s4, and the third parity is the XOR of s1, s3 and s4. The fifth column of Table 2, labeled MEV*, lists the value of the best minimal erasures vector in the corpus. The sixth column labeled, d*, lists the best Hamming distance in the corpus (i.e., the index of the first non-zero entry in MEV*).

The following observations can be deduced from the results listed in Table 2. First, as m increases for some fixed k, the best MEV improves, corresponding to an increase in redundancy. As k increases for some fixed m, the best MEV degrades, as the same amount of redundancy is used to protect more data. Second, the data symbols for the more fault tolerant codes are included by at least d* parity symbols. Hence, the more fault tolerant codes have higher Hamming weights (i.e., are more connected). Third, from the above results there does not appear to exist a systematic-based erasure code with $5 \leq k \leq 7$ and m=7 that tolerates all erasures of size 4.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method executed by a computer of selecting a more fault tolerant erasure code from a plurality of erasure codes for use in a fault tolerant system, comprising:
generating a plurality of Tanner graphs corresponding to the plurality of erasure codes;
generating a set of preferred erasure codes by discarding an erasure code if the corresponding Tanner graph does not have at least one predefined characteristic, the at least one predefined characteristic including a connected characteristic in which every node of the corresponding Tanner graph is reachable by traversing edges of the corresponding Tanner graph starting from any one node;
comparing fault tolerances of the set of preferred erasure codes based at least in part on the corresponding Tanner graphs; and
selecting a more fault tolerant erasure code from the set of preferred erasure codes based on the comparison.

2. The method as recited in claim 1, further comprising:
generating lists of erasure patterns corresponding to non-discarded erasure codes, wherein generating the set of preferred erasure codes is further based on the lists of erasure patterns.

3. The method as recited in claim 2, further comprising:
generating a set of erasure vectors corresponding to the set of preferred erasure codes, wherein comparing the fault tolerances comprises comparing the erasure vectors.

4. The method as recited in claim 2, wherein the lists of erasure patterns are lists of minimal erasure patterns.

5. The method as recited in claim 1, wherein the at least one predefined characteristic further includes a degree of the Tanner graph, and the method further comprises providing a Hamming distance, and wherein an erasure code is discarded if the degree of the corresponding Tanner graph is not equal to the Hamming distance.

6. The method as recited in claim 1, wherein the at least one predefined characteristic further includes a total number of edges, and the method further comprises providing a range of Hamming weights, and wherein an erasure code is discarded if the total number of edges of the Tanner graph does not fall within the range of Hamming weights.

7. The method as recited in claim 1, further comprising:
employing the more fault tolerant code in a fault tolerant system.

8. A method executed by a computer of comparing fault tolerance of a plurality of erasure codes, comprising:
generating a first set of erasure patterns corresponding to a first erasure code;
generating a first erasure vector based on the first set of erasure patterns;
determining a first fault tolerance associated with the first erasure code based on the first erasure vector;
generating a second set of erasure patterns corresponding to a second erasure code; and
based on the second set of erasure patterns, terminating evaluation of the second erasure code if the second erasure code cannot be more fault tolerant than the first erasure code;
else, completing generation of a second erasure vector based on the second set of erasure patterns.

9. The method as recited in claim 8, further comprising:
providing a Hamming distance; and
terminating evaluation of the second erasure code if an erasure pattern of the second set of erasure patterns has a length less than the Hamming distance.

10. The method as recited in claim 8, further comprising:
generating second entries for the second erasure vector in smallest to largest size order;
comparing each size second entry with a corresponding size first entry in the first erasure vector as each second size entry is generated; and
terminating generation of the second entries for the second erasure vector as soon as the comparison determines that the second erasure code cannot be more fault tolerant than the first erasure code.

11. The method as recited in claim 8, wherein the first and second set of erasure patterns are generated up to an erasure length cutoff.

12. The method of claim 8, wherein terminating the evaluation of the second erasure code prevents generation of the second erasure vector based on the second set of erasure patterns.

13. A method executed by a computer of evaluating fault tolerances of erasure codes, comprising:
   generating first sets of erasure patterns corresponding to a plurality of erasure codes;
   generating first erasure vectors based on the first sets of erasure patterns;
   comparing the first erasure vectors to determine, according to a first criterion, a plurality of more fault tolerant erasure codes;
   generating second sets of second erasure patterns corresponding to the more fault tolerant erasure codes;
   generating second erasure vectors based on the second sets of second erasure patterns; and
   comparing the second erasure vectors to determine, according to a second, different criterion, a preferred erasure code from the plurality of more fault tolerant erasure codes.

14. The method as recited in claim 13, wherein the first sets of erasure patterns are composite erasure lists, and the second sets of erasure patterns are minimal erasures lists, and wherein the second sets of erasure patterns are generated by testing for minimality only the first sets of erasure patterns that correspond to the plurality of more fault tolerant erasure codes.

15. The method of claim 14, wherein determining the plurality of more fault tolerant erasure codes is based on a technique that does not test the first sets of erasure patterns for minimality.

16. The method as recited in claim 13, wherein the first sets of erasure patterns include only erasure patterns up to a first predefined length, and wherein the second sets of erasure patterns include only erasure patterns up to a second predefined length, wherein the second predefined length is greater than the first predefined length.

17. The method as recited in claim 13, further comprising:
   employing the preferred erasure code in a fault tolerant system.

* * * * *

UNITED STATES PATENT AND TRADEMARK OFFICE
CERTIFICATE OF CORRECTION

PATENT NO. : 8,250,427 B2
APPLICATION NO. : 12/243471
DATED : August 21, 2012
INVENTOR(S) : John Johnson Wylie et al.

It is certified that error appears in the above-identified patent and that said Letters Patent is hereby corrected as shown below:

On the title page, in item (73), Assignee, in column 1, line 2, after "Company," insert -- L.P., --.

Signed and Sealed this
Twenty-eighth Day of May, 2013

Teresa Stanek Rea
*Acting Director of the United States Patent and Trademark Office*